(12) United States Patent
Miyaguchi et al.

(10) Patent No.: US 6,297,589 B1
(45) Date of Patent: Oct. 2, 2001

(54) ORGANIC ELECTROLUMINESCENCE FULL COLOR DISPLAY PANEL AND METHOD OF MANUFACTURING THE SAME

(75) Inventors: Satoshi Miyaguchi; Hirofumi Kubota; Shinichi Ishizuka; Kenji Yoshida, all of Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/393,805

(22) Filed: Sep. 10, 1999

(30) Foreign Application Priority Data

Sep. 11, 1998 (JP) .................................... 10-258086

(51) Int. Cl.$^7$ ...................................... H01J 63/04
(52) U.S. Cl. ............................. 313/504; 313/506
(58) Field of Search ..................... 313/498, 503, 313/504, 506, 509, 512

Primary Examiner—Vip Patel
(74) Attorney, Agent, or Firm—Sughrue, Mion, Zinn, Macpeak & Seas, PLLC

(57) ABSTRACT

An organic EL full color display panel includes a plurality of transparent electrode lines formed in parallel on a base plate; an insulating layer formed on the base plate, the insulating layer covering respective edges of the transparent electrode lines and having openings formed correspondingly to pixel regions on the transparent electrode lines; at least one organic EL material layer formed so as to correspond to the pixel regions and having any light-emitting function of R, G and B, and a plurality of metallic electrode lines arranged in parallel perpendicularly to the transparent electrode lines, each of the metallic electrode entirely covering the pixel regions of the three pixels of R, G and B. The insulating layer insulates the transparent electrode lines and metallic electrode lines from each other in other regions than the pixel regions. In this configuration, the organic full color display panel can emit a specified color surely at low cost.

21 Claims, 14 Drawing Sheets

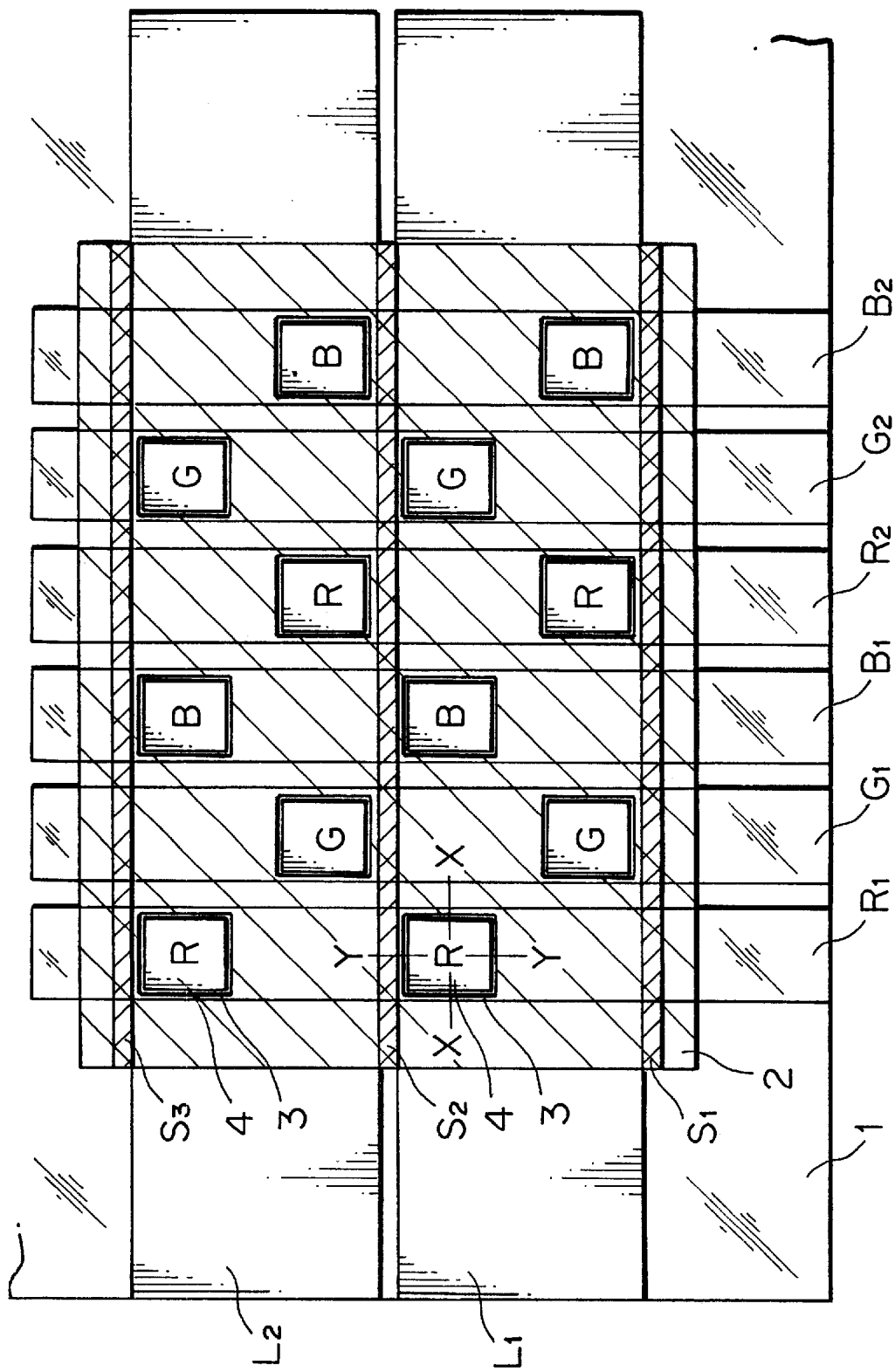

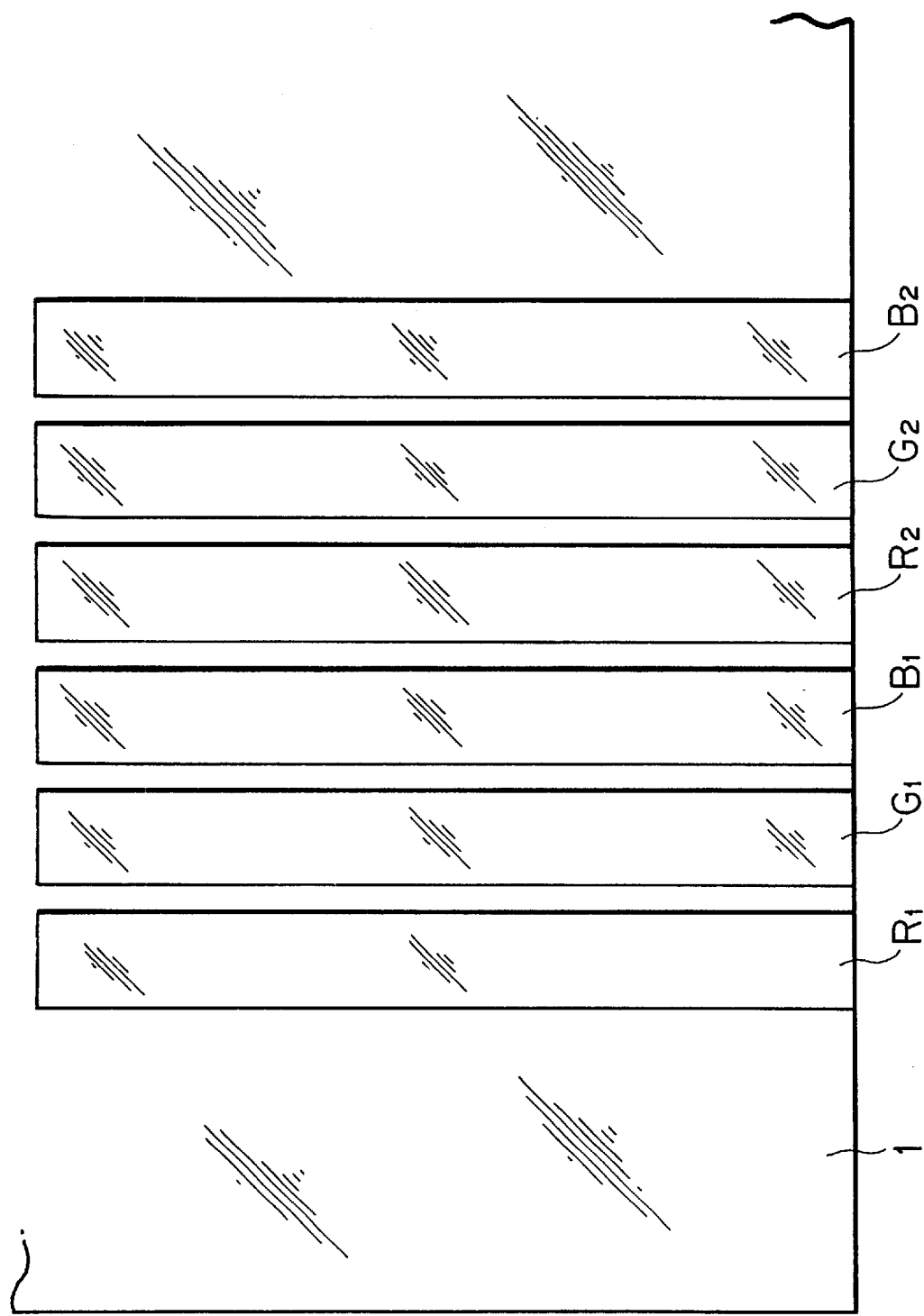

ORGANIC ELECTROLUMINESCENCE FULL COLOR DISPLAY PANEL AND METHOD OF MANUFACTURING THE SAME

BACKGROUND OF THE INVENTION

1. Field of the Invention

The present invention relates to an organic EL (electroluminescence) full color display panel and a method of manufacturing it.

2. Description of the Related Art

FIG. 15 shows a section of a conventional dot matrix display panel using an organic EL device. As seen, on a transparent base plate (glass plate) 1 of e.g. ITO, a plurality of transparent electrode lines (anodes) A1–An (only A1, A2 are shown) are arranged in parallel at regular intervals. On the transparent electrode lines A1–An, an organic EL material layer 4 is formed which includes a hole transporting layer, a light-emitting layer and an electron transporting layer. Further, a plurality of metallic electrode lines L1–Ln are arranged thereon at regular intervals.

The transparent electrode lines A1–An and the metallic electrode lines L1–Lm are extended in directions crossing each other. Each crossing area constitutes a light emitting region (unit pixel) to sandwich an organic EL material layer.

Further, an insulating layer 2 is formed so as to cover the edge of each of the transparent electrode lines A1–An. The insulating layer 2 is formed to prevent cross-talk light emission in the organic EL dot matrix display. The insulating layer 2, which covers the edge of each of the transparent electrode lines A1–An where a driving current is apt to be concentrated, prevents a current from flowing into the organic EL material layer 4 on the transparent electrode lines, thereby preventing false light emission.

In recent years, in an application of the organic EL dot matrix display, attempts of implementing full color have been made. However, in such attempts, three kinds of organic EL materials for the light emission of red (R), green (G) and blue (B) are required for the light emitting layer, and must be applied to each of pixels. This leads an increase in the cost of material and complication in the manufacturing process as compared with a monochromatic display. The present invention has been accomplished in order to solve the problem as described above.

SUMMARY OF THE INVENTION

An object of an organic EL full color display which can be manufactured at reduced cost, and a method of manufacturing it.

In order to achieve the above object, in accordance with the present invention, there is provided an organic EL full color display panel with three pixels of R, G and B located most proximate to one another arranged in a delta shape, comprising: a base plate; a plurality of transparent electrode lines formed in parallel on the base plate; an insulating layer formed on the base plate, the insulating layer covering respective edges of the transparent electrode lines and having openings formed so as to correspond to pixel regions on the transparent electrode lines; at least one organic EL material layer formed so as to correspond to the pixel regions and having any light-emitting function of R, G and B, and a plurality of metallic electrode lines arranged in parallel perpendicularly to the transparent electrode lines, each of the metallic electrode entirely covering the pixel regions of the three pixels of R, G and B, wherein the insulating layer insulates the transparent electrode lines and metallic electrode lines from each other in other regions than the pixel regions.

In this configuration, the insulating layer formed on the base plate can cover the edges of each of the transparent electrode lines and determine a pixel region on each of the transparent electrode lines. In the other areas than the pixel regions, the insulating layer can also prevent short-circuiting between the transparent electrode lines and the metallic electrode lines. Therefore, the organic EL full color display panel can be provided at low manufacturing cost.

The above and other objects and features of the present invention will be more apparent from the following description taken in conjunction with the accompanying drawings.

BRIEF DESCRIPTION OF THE DRAWINGS

FIG. 1 is a perspective plan view of a first embodiment of an organic EL full color display panel according to the present invention;

FIGS. 3 to 7 are views for explaining a process of manufacturing the first embodiment of the organic EL full color display panel according to the present invention;

DESCRIPTION OF THE PREFERRED EMBODIMENTS

Embodiment 1

Now referring to FIGS. 1 and 2, an explanation will be given of a first embodiment of an organic EL full color display panel according to the present invention.

Figure 2A:
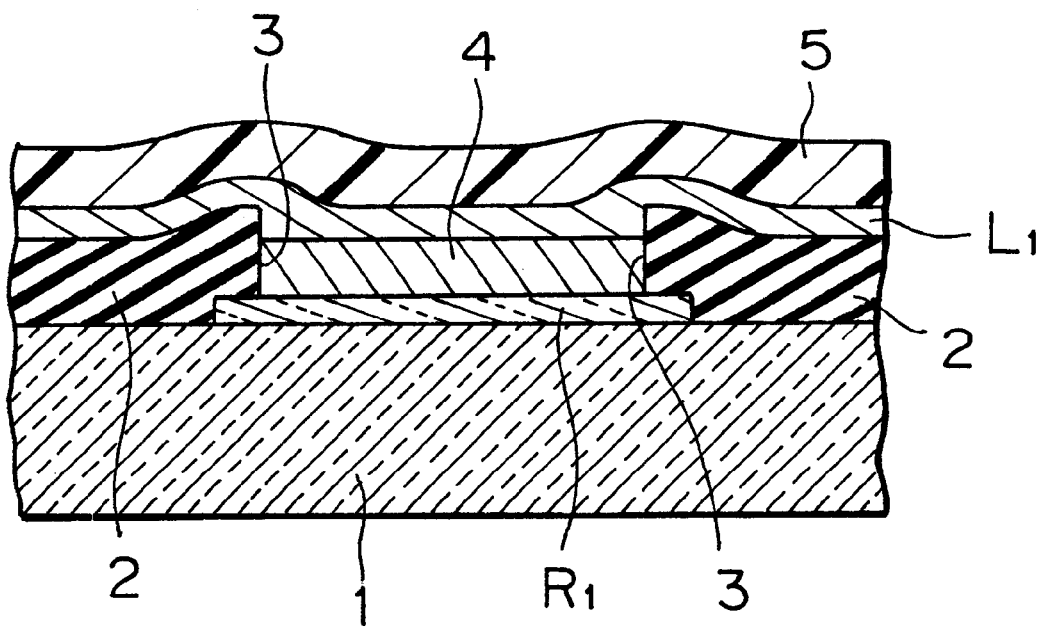
FIGS. 2A and 2B are sectional views taken in lines X—X and Y—Y, respectively.
Figure 2B:
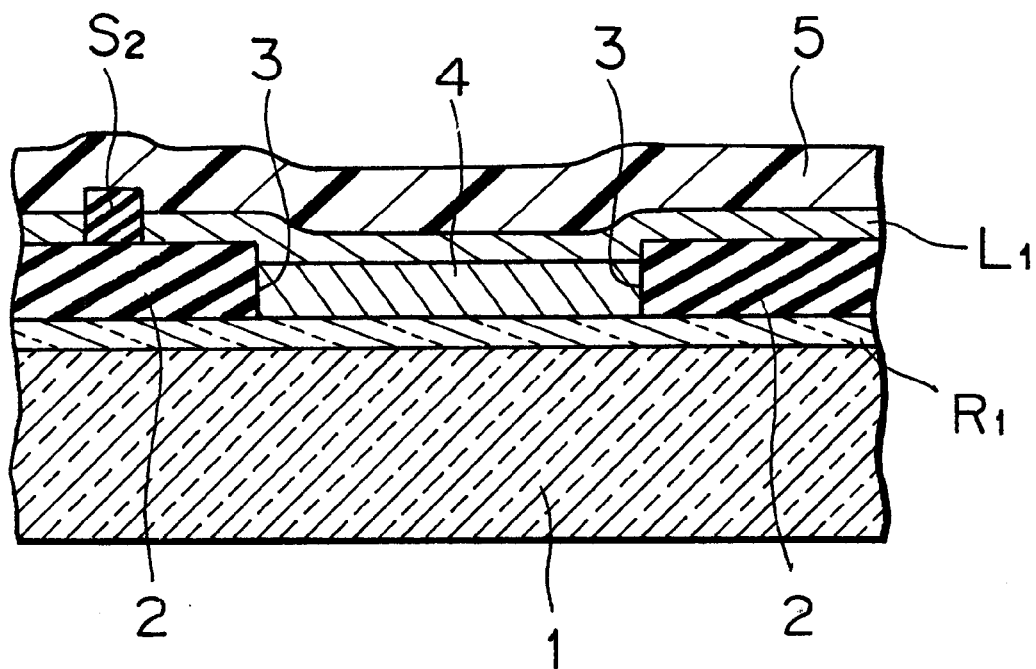

FIG. 1 is a perspective plan view of the first embodiment of an organic EL full color display panel according to the present invention, and FIGS. 2A and 2B are sectional views taken in lines X—X and Y—Y, respectively.

As shown in FIGS. 1 and 2, transparent electrode lines R1, G1, B1; R2, G2, B2; . . . (hereinafter, when not specified, referred to as Rn, Gn, Bn) are arranged in parallel in regular intervals. Now, Rn denotes a transparent electrode line to which a red light-emitting pixel is connected. Gn denotes a transparent electrode line to which a green light-emitting pixel is connected. Bn denotes a transparent electrode line to which a blue light-emitting pixel is connected.

An insulating layer 2 is formed on a base plate 1 on which the transparent electrode lines Rn, Gn, Bn are formed.

L1, L2, . . . (hereinafter, when not specified, referred to as Lm) are a plurality of metallic lines formed in a direction perpendicular to the transparent electrode lines Rn, Gn, Bn, as described later.

At positions in the insulating layer where the transparent electrode lines Rn, Gn, Bn cross the metallic electrode lines Lm, openings 3 are alternately up and down provided when each of the metallic electrode lines is divided into two parts in its width direction.

The openings 3 are provided to be located inward from the side ends of the transparent electrode lines Rn, Gn, Bn and the metallic electrode lines Lm's. Therefore, as shown in FIG. 2A, the edges of the transparent electrode lines Rn, Gn and Bn and those of the metallic electrode lines Lm's are covered with the insulating layer 2, thereby preventing cross-talk light emission. The openings 3 correspond to light-emitting pixels, as described later.

The insulating layer 2 is formed to cover the entire surface of the regions of the base plate where the transparent electrode lines are formed, except the openings 3. Therefore, except the openings 3, the regions where the transparent electrode lines Rn, Gn, Bn and the metallic electrode lines Lm cross each other are entirely covered with the insulating layer 2. Thus, in the other regions than the pixels, short-circuiting between the transparent electrode lines Rn, Gn, Bn between the metallic electrode lines Lm's can be avoided. In this way, the insulating layer 2 which is a single continuous layer serves to prevent the cross-talk light emission and also prevent the short-circuiting between both electrodes in the other regions than the openings 3.

Further, separating walls S1, S2, S3, . . . (hereinafter, when not specified, referred to as Sm) are provided so as to protrude from the insulating layer 2 to isolate the metallic electrode lines L1, L2, . . . from one another.

In each opening 3, on the transparent electrode lines Rn, Gn, Bn, organic EL material layers 4 each having a function of light emission are formed in an delta arrangement. The organic EL layer emitting R, G or B intends to increase the light emitting efficiency in such a way that it is sandwiched on both sides by a hole transporting layer and an electron transporting layer.

Between the organic EL material layer 4 and the separating wall Sm on the insulating layer 2, the metallic electrode line Lm described above is formed.

As seen from FIG. 1, the metallic electrode line Lm is formed in such a manner that its width is twice or more as long as the length of the pixel (opening 3) in an extending direction of the transparent electrode line Rn, Gn, Bn. The single metallic line Lm is formed so as to cover all the pixels of R, G, B. A protection layer 5 is formed outside the metallic electrode line Lm.

Referring to FIGS. 3–7, an explanation will be given of a method of manufacturing an organic EL full color display panel according to the present invention.

First, as shown in FIG. 3, on a transparent base plate 1 of e.g. glass, transparent electrode lines R1, G1, B1; R2, G2, B2; . . . made of e.g. ITO and having a thickness of e.g. 0.11 $\mu$m are formed in parallel at regular intervals.

Figure 4:
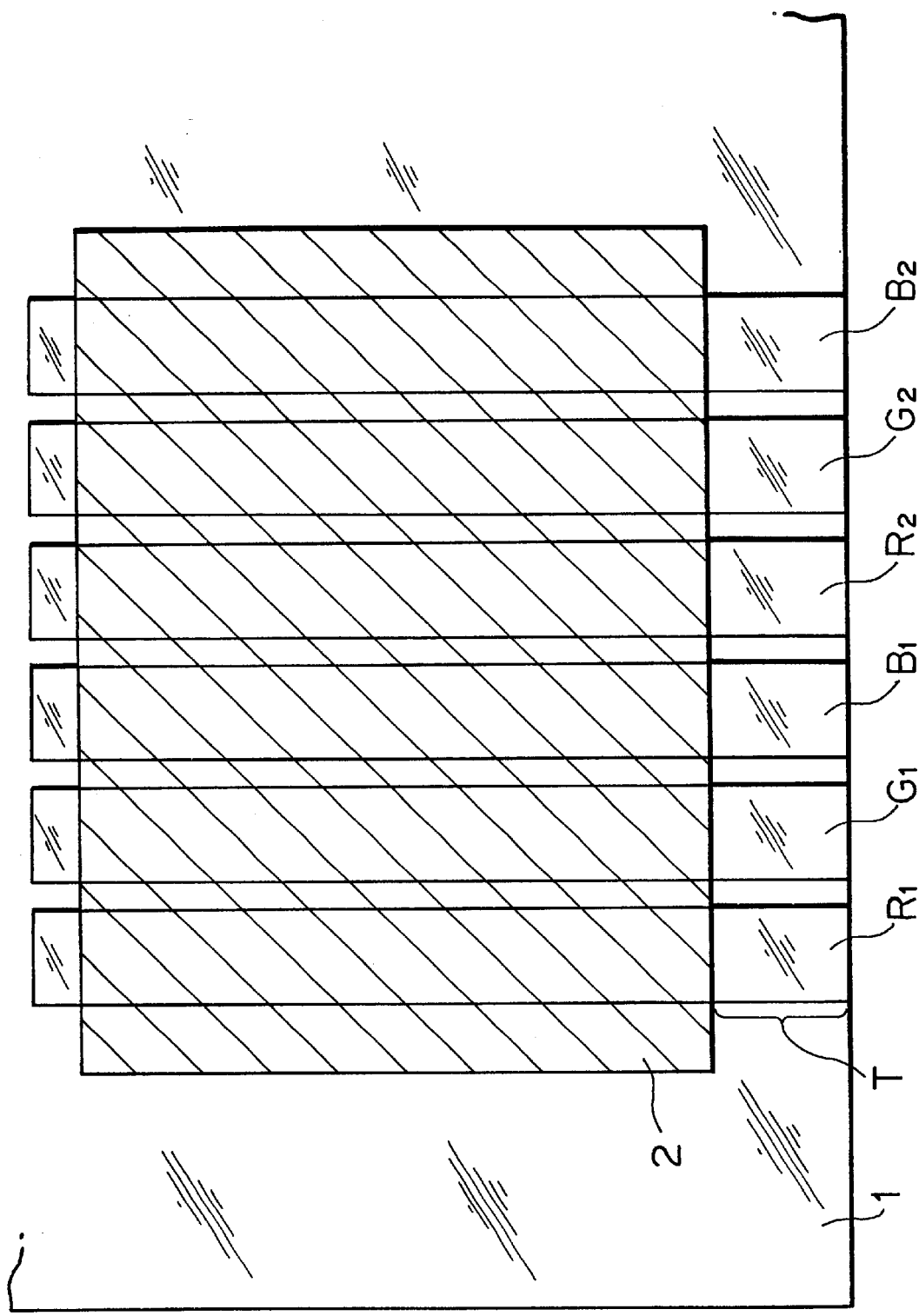

Next, as seen from FIG. 4, on the entire surface of the base plate with the transparent electrode lines Rn, Gn, Bn being formed, except the terminal areas T of the transparent electrode lines Rn, Gn, Bn, an insulating layer 2 of e.g. SiO2 or polyimide having a thickness of e.g. 0.8 $\mu$m is formed. In this case, the SiO2 layer is formed by sputtering, and the polyimide layer is formed by spin coating.

Figure 5:
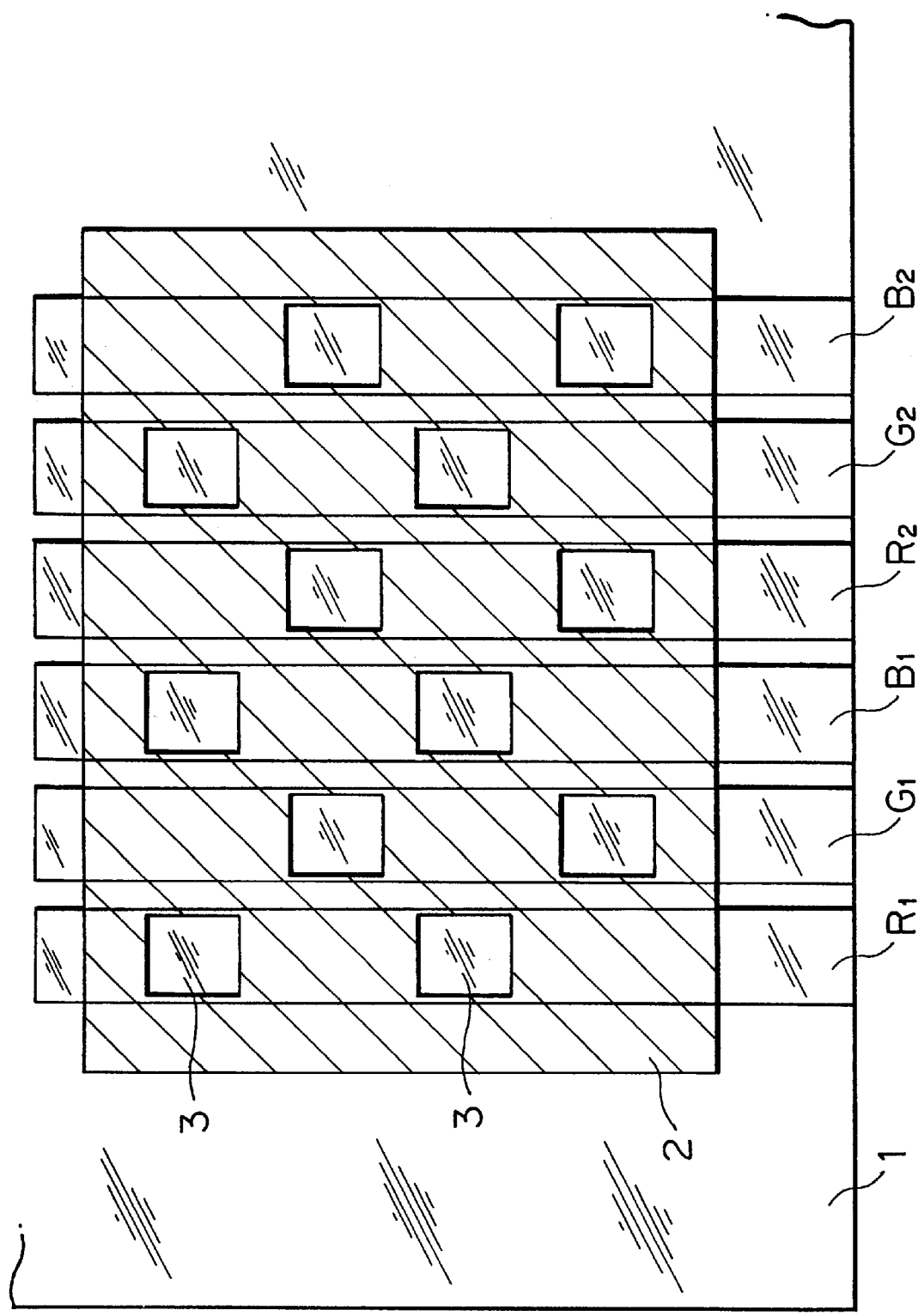

As seen from FIG. 5, openings 3 are formed on the corresponding transparent electrode lines Rn, Gn, Bn in the insulating layer 2.

Referring to FIGS. 8A–8D, a process for forming the openings will be explained.

Figure 8A:
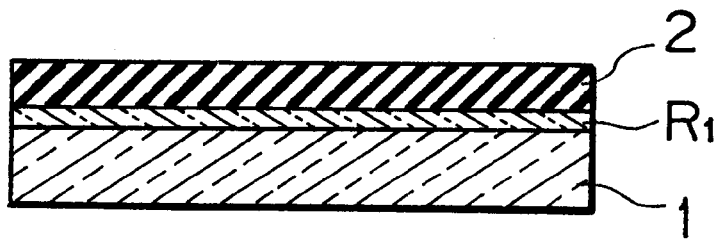
FIGS. 8A–8D are views for explaining a technique for making an opening.
Figure 8B:
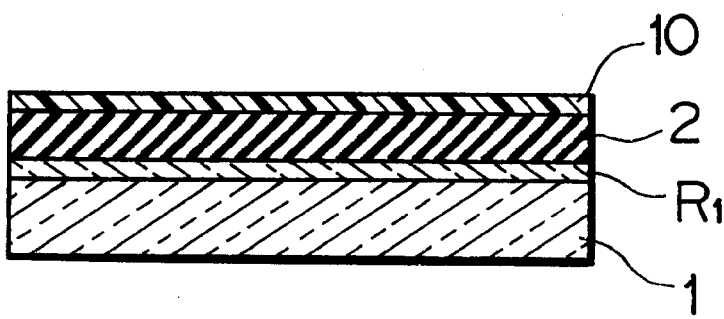

First, as seen from FIG. 8B, a resist film 10 is formed on the insulating layer 2 shown in FIG. 8A by spin coating.

Figure 8C:
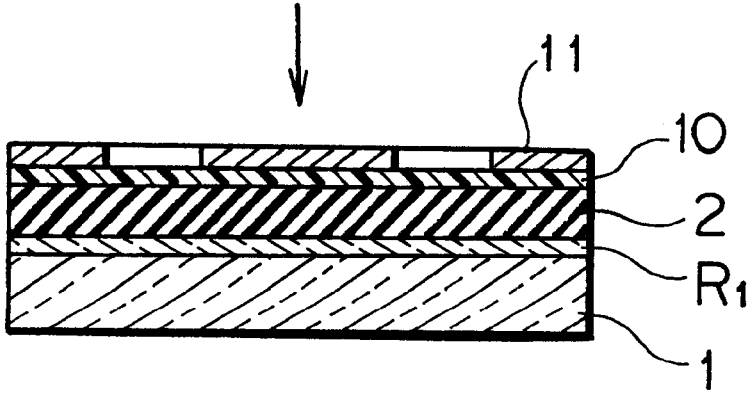

As seen from FIG. 8C, with a mask 11 located on the resist film 10, the resist film 10 is irradiated with light to form a pattern (corresponding to the opening 3) of the mask 11.

Figure 8D:
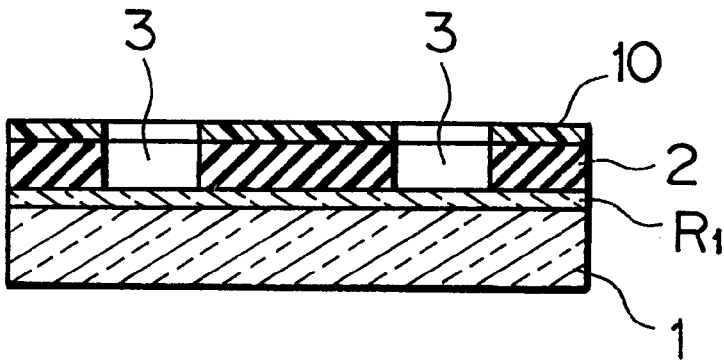

As seen from FIG. 8D, the mask 11 is removed, and the areas of the resist film 10 exposed to light and insulating film 2 are etched to form the openings 3. In this case, the SiO2 layer 2 is subjected to reactive ion etching, and the polyimide layer 2 is immersed in a development solution. Finally, the resist film 10 remaining on the surface after the openings 3 have been formed is removed. Thus, the openings 3 are completed.

Figure 6:
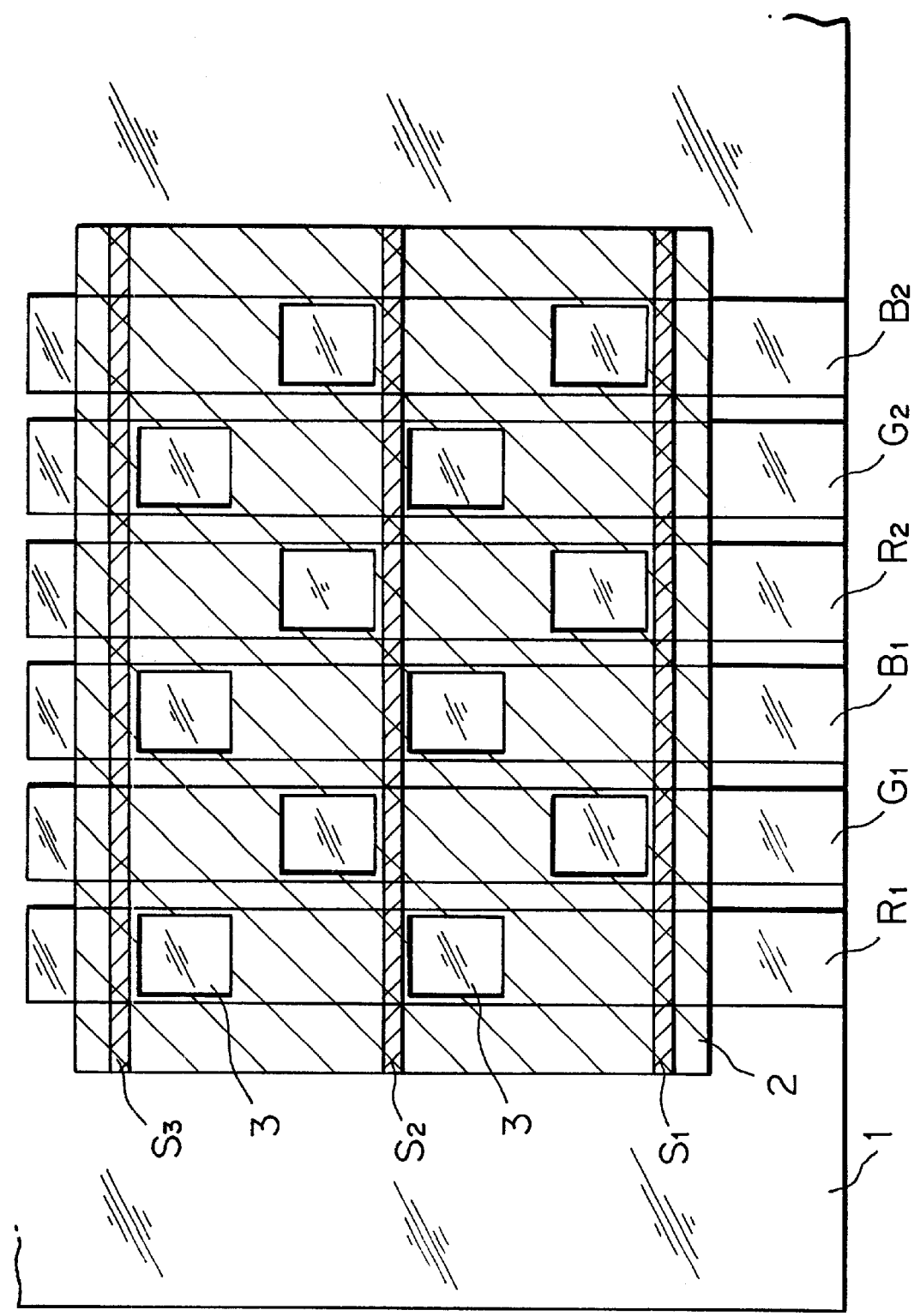

Thereafter, as shown in FIG. 6, separating walls S1, S2, S3, . . . each for separating the metallic electrode lines Lm are formed on the insulating layer 2 at regular intervals so that they protrude from the insulating layer so as to have a thickness of 5 $\mu$m and are orthogonal to the transparent electrode lines Rn, Gn, Bn. The separating wall Sm can be formed by etching in the same manner as forming the openings 3 in the insulating layer 2. In this case, where the insulating layer 2 is formed of SiO2, the separating walls Sm are preferably formed of polyimide. This is because etching of polyimide does not exert an influence on the insulating layer 2 formed of SiO2.

Figure 7:
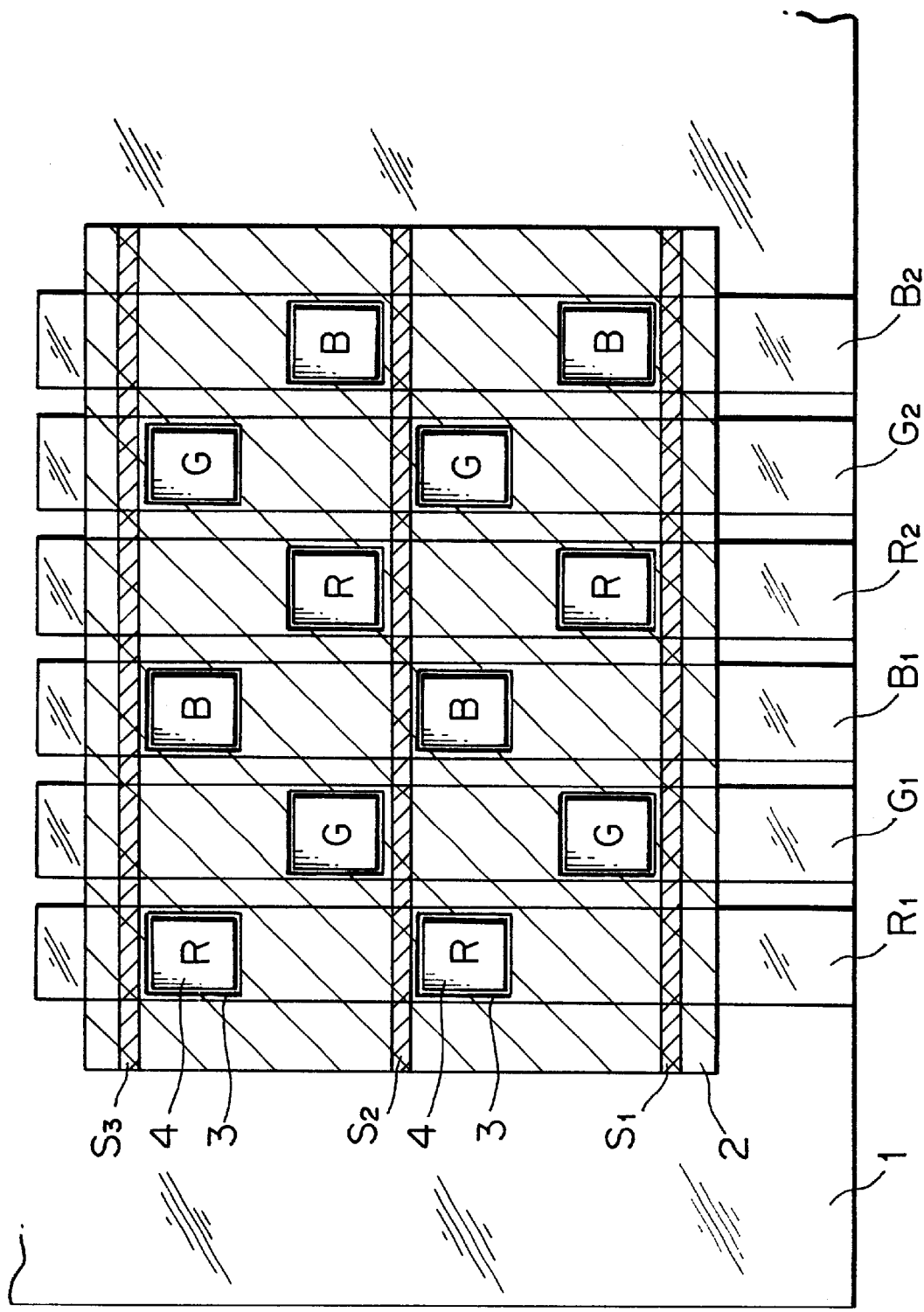

Next, as shown in FIG. 7, organic EL material layers 4 which emit light in R, G, B are deposited on the openings 3 in a delta arrangement. In this case, these EL material layers 4 are deposited to have prescribed thicknesses (e.g. R 0.177 $\mu$m, G 0.255$\mu$, B 0.185 $\mu$m). The deposition of the EL material layer corresponding to R, G or B is carried out through the mask with the area corresponding to the pixel being opened.

Finally, as shown in FIG. 1, with a mask located on the separating walls S1, S2,S3, . . . , the metallic layers L1, L2, . . . deposited on the resultant surface. Finally, a protection layer 5 is formed on the metallic layers Lm and separating layers Sm.

In accordance with the method described above, the following effects can be obtained.

(1) Cross-talk light emission can be prevented.
(2) The insulating film for preventing cross-talk and that for preventing short-circuiting between both electrodes can be formed as the single insulating layer 2 using the same material through the same process. This facilitates easiness of manufacturing.
(3) The area and position of each pixel can be specified so that a prescribed luminance and color can be obtained from each pixel.
(4) Since the metallic electrode lines Lm can be patterned by the separating walls Sm, they can be positioned precisely.
(5) Since the mask for deposition of the organic EL material layer according to R, G or B can be precisely fixed in contact with the separating walls Sm and in proximate positions, displacement of the organic EL material layer 4 can be eliminated.

Embodiment 2

Figure 9:
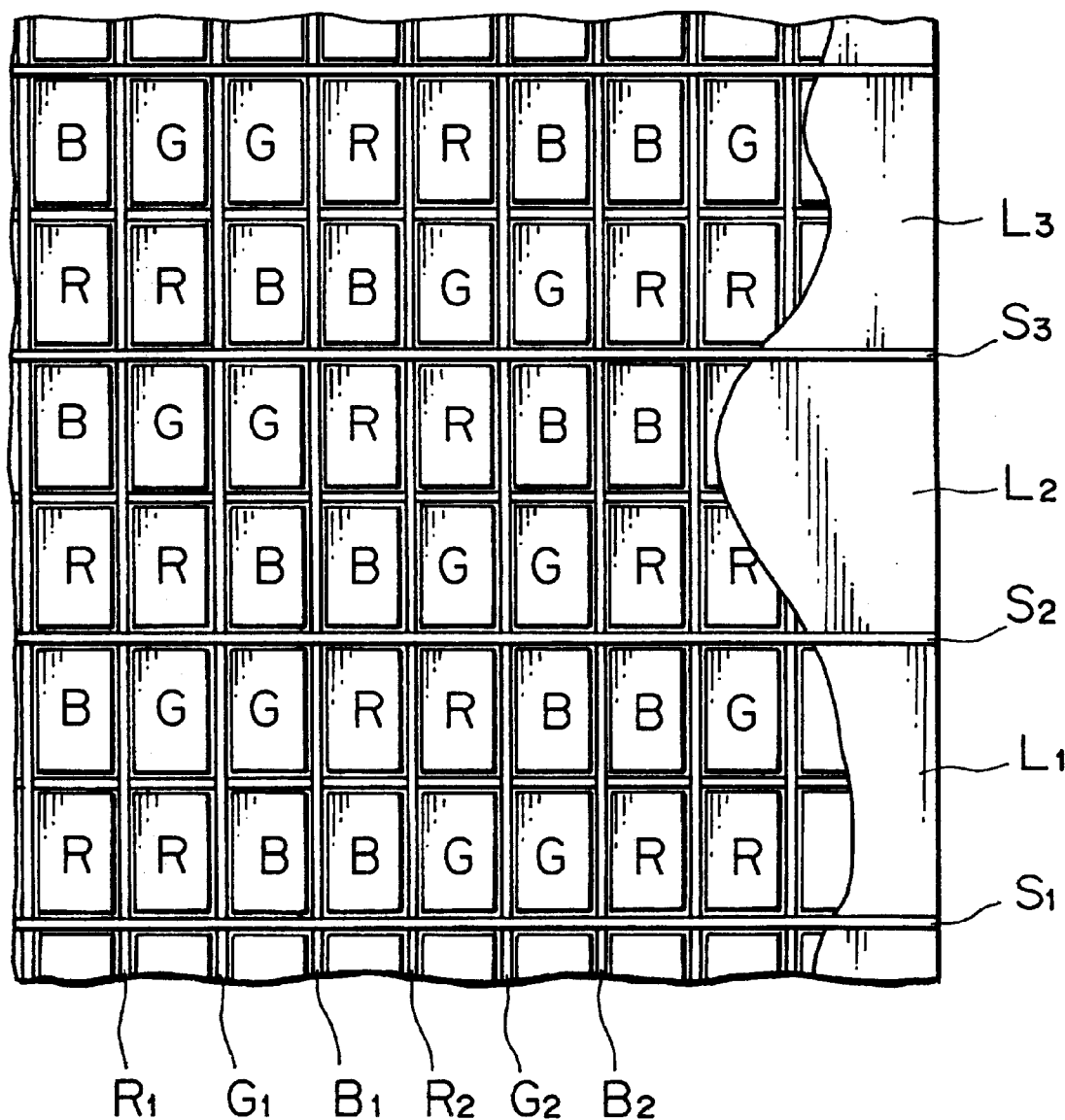
FIG. 9 is perspective plan view of a second embodiment of an organic EL full color display panel according to the present invention.

Now referring to FIG. 9, an explanation will be given of an organic EL full color display panel according to the second embodiment of the present invention. FIG. 9 is a plan view of such a display panel.

In the first embodiment, as described in connection with FIG. 1, the openings 3 which constitute the pixel regions were made on the transparent electrode lines Rn, Gn, Bn each having a prescribed width. Therefore, the area rate of the openings to the entire panel is relatively small so that the light emitting luminance also becomes small. This requires for each of the pixels to emit light at a high luminance.

In the second embodiment, the area occupied by each of the openings 3 is increased in such a way that the width of the opening 3 of each of the transparent electrode lines Rn, Gn, Bn illustrated in connection with FIG. 1 is increased and the other portion than each opening is decreased. Therefore, as shown in FIG. 9, the pixels are successively arranged in a displaced manner of 1 pixel by 1 pixel in a direction of the metallic electrode line and 0.5 pixel by 0.5 pixel in a direction of the transparent electrode.

Figure 10:
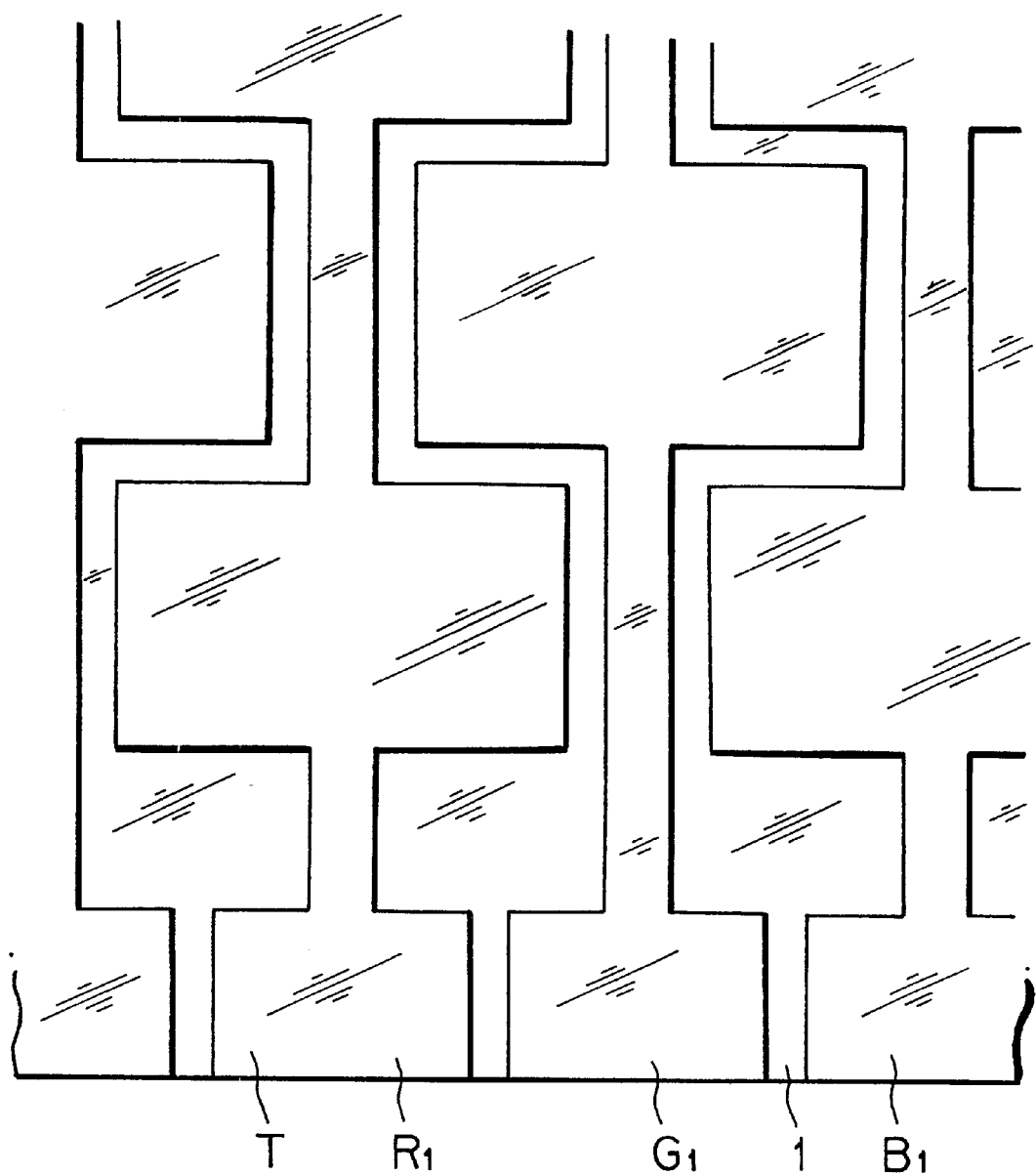
FIGS. 10 to 14 are views for explaining a process of manufacturing the second embodiment of the organic EL full color display panel according to the present invention.

Thus, in contrast to the transparent electrode lines R1, G1, B1 in the first embodiment as shown in FIG. 3, in the second embodiment, as shown in FIG. 10, transparent electrode lines R1, G1, B1, . . . are made in each of which a wide area and a narrow area are alternately repeated.

Figure 11:
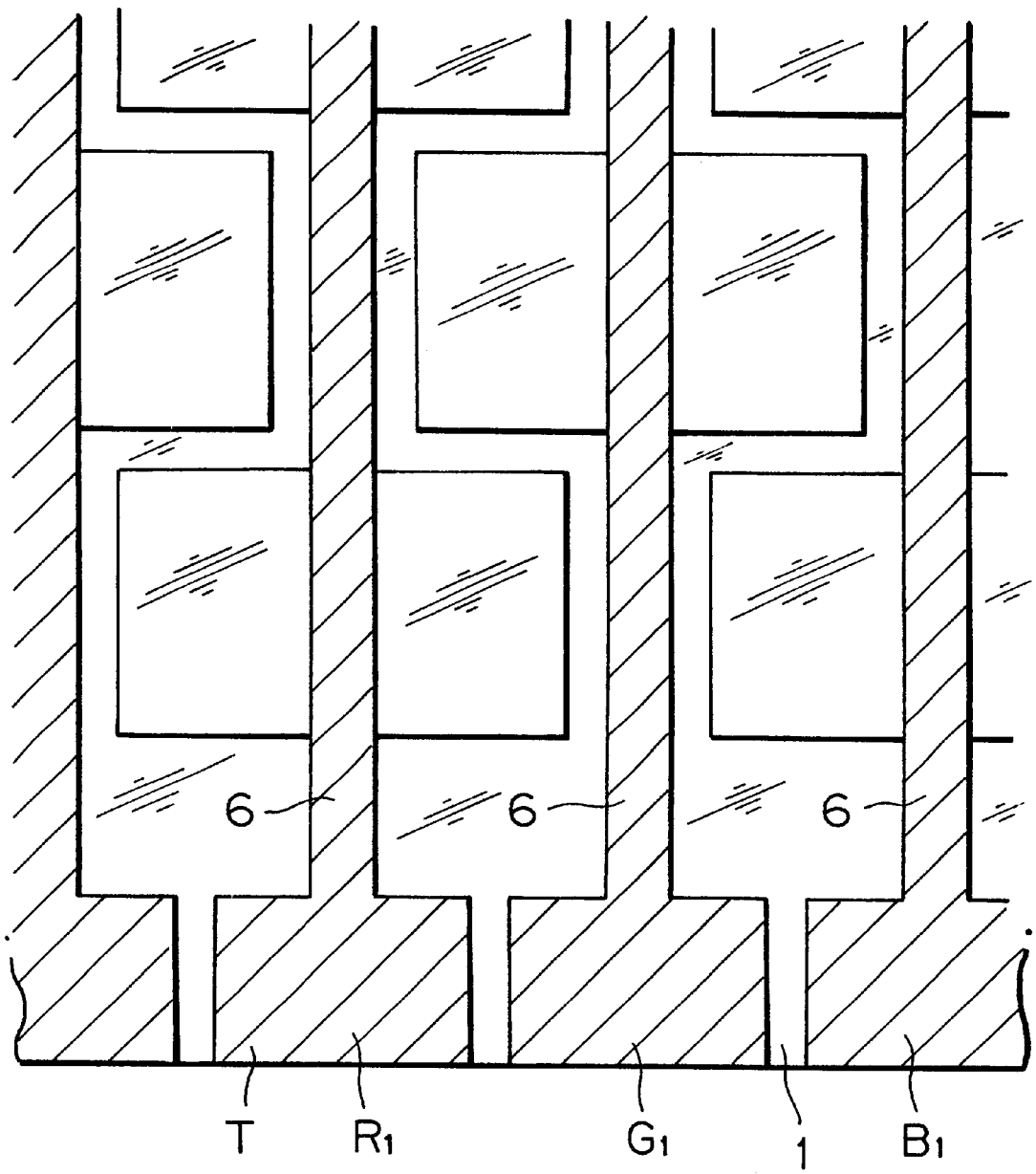

In the second embodiment, as shown in FIG. 11, a conductive layer 6, which is made of a material having good electric conductivity, and has the above narrow area (width), is formed on each of the transparent electrode lines R1, G1, B1 inclusive of the corresponding connecting terminal T. This is a manufacturing step which is not required in the first embodiment.

The conductive layers are formed for the following reason. The narrow area of each of the transparent electrode lines R1, G1, B1 has an increased electric resistance, which leads to a voltage drop in a pixel remote from the connecting terminal. Therefore, the pixel emits light with a lower luminance than a prescribed luminance even when a prescribed current is supplied. The conductive layer 6 decreases the electric resistance so that the pixel remote from the connecting terminal T can also emit light with a prescribed luminance.

The conductive layer 6 may be extended to the wide area. In this case also, since the conductive layer 6 is narrow, the area of the pixel is not reduced greatly, and the electric resistance of each transparent electrode line can be reduced.

Figure 12:
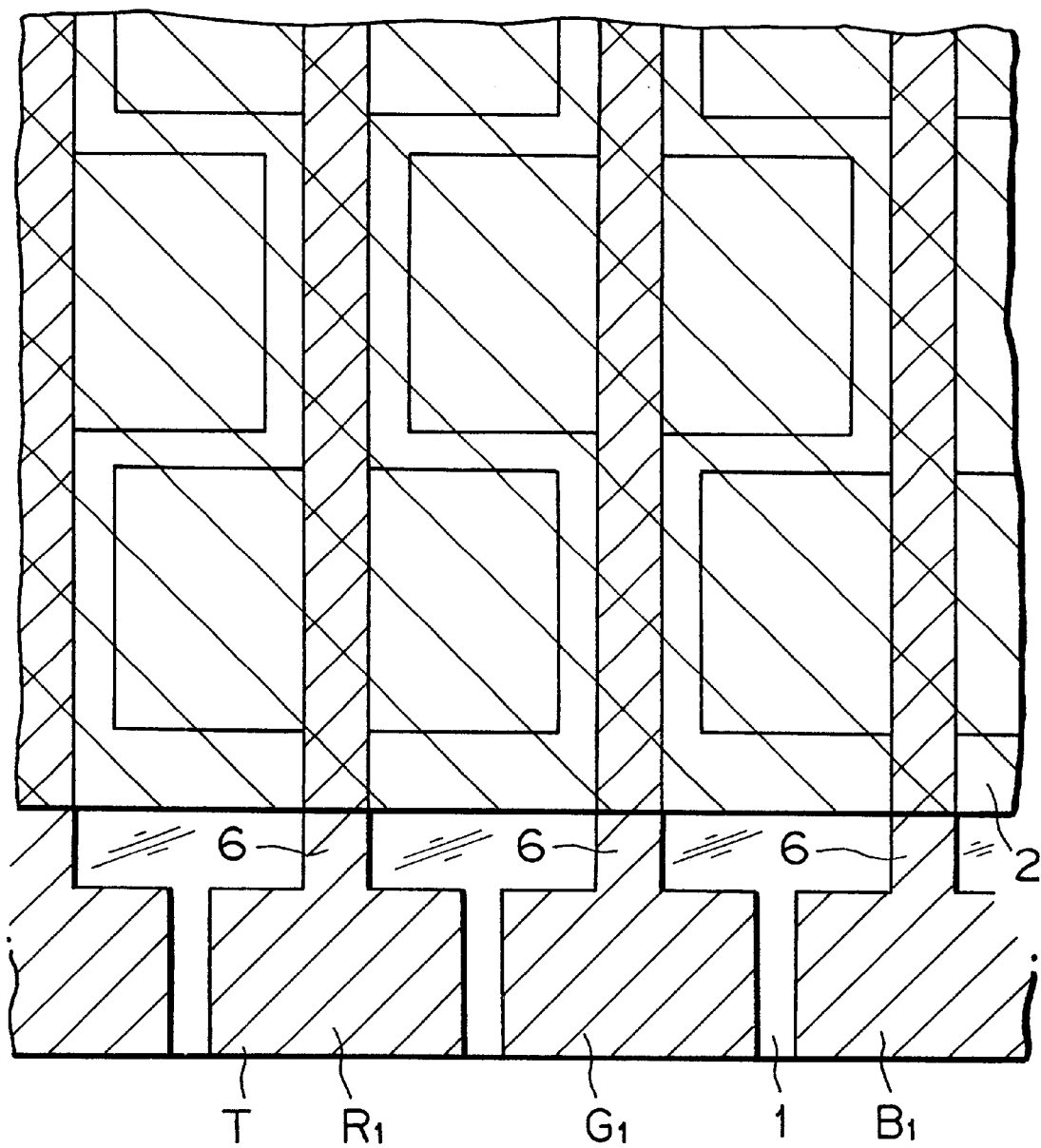

In FIG. 11, although the connecting terminal T is formed at the one end of each of the transparent electrode lines R1, G1, B1, . . . , it can be also formed at the other end (not shown). In this case, by supplying a current from both connecting terminals, the electric resistance can be further reduced, formed as shown in FIG. 12.

Figure 13:
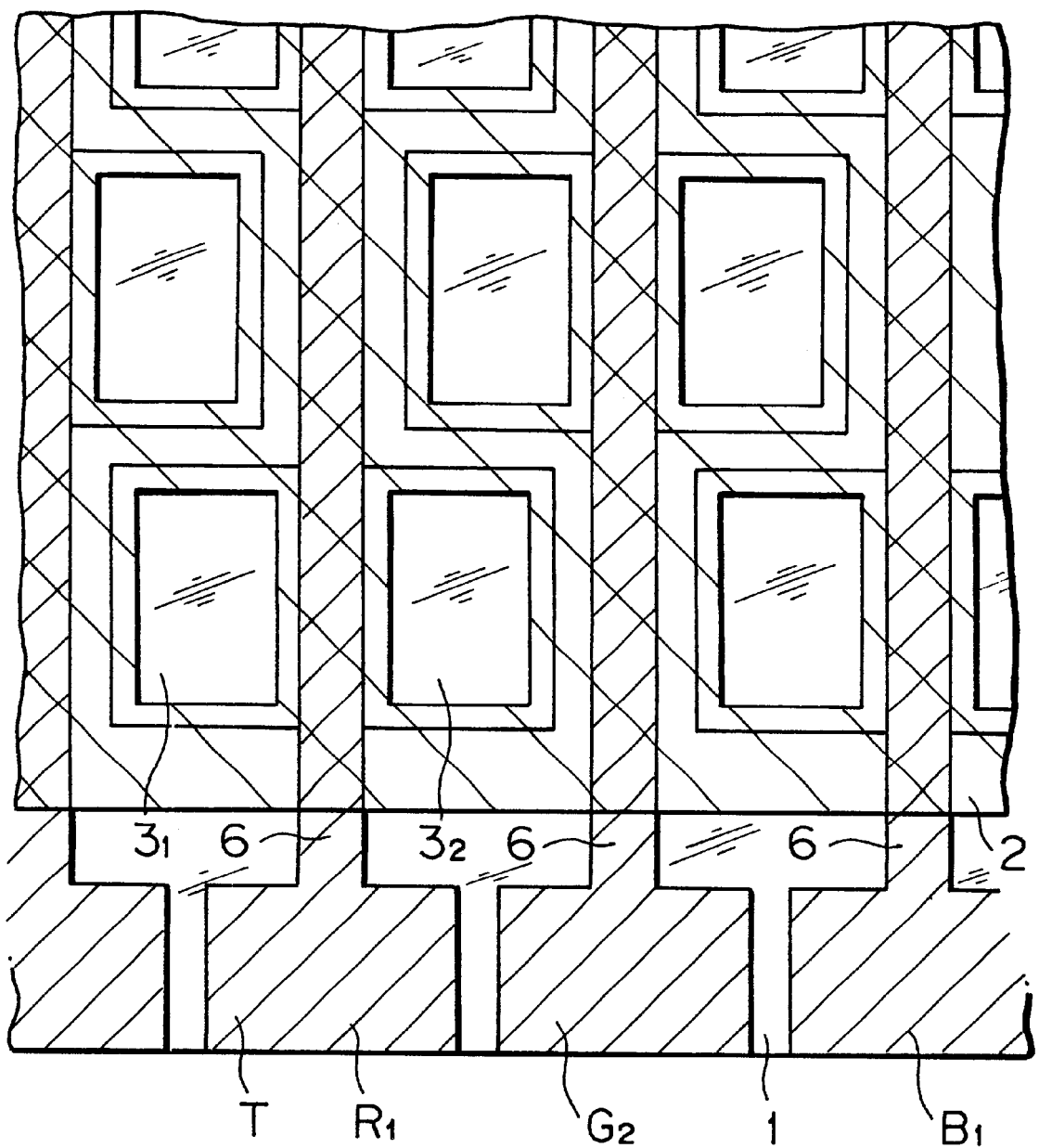

Further, as shown in FIG. 13, openings 3 and 32 are formed in the wide area of each of the transparent electrode lines R1, G1, B1 and on both sides of the conductive layer 6. The openings $3_1$ and $3_2$ constitute one pixel.

Figure 14:
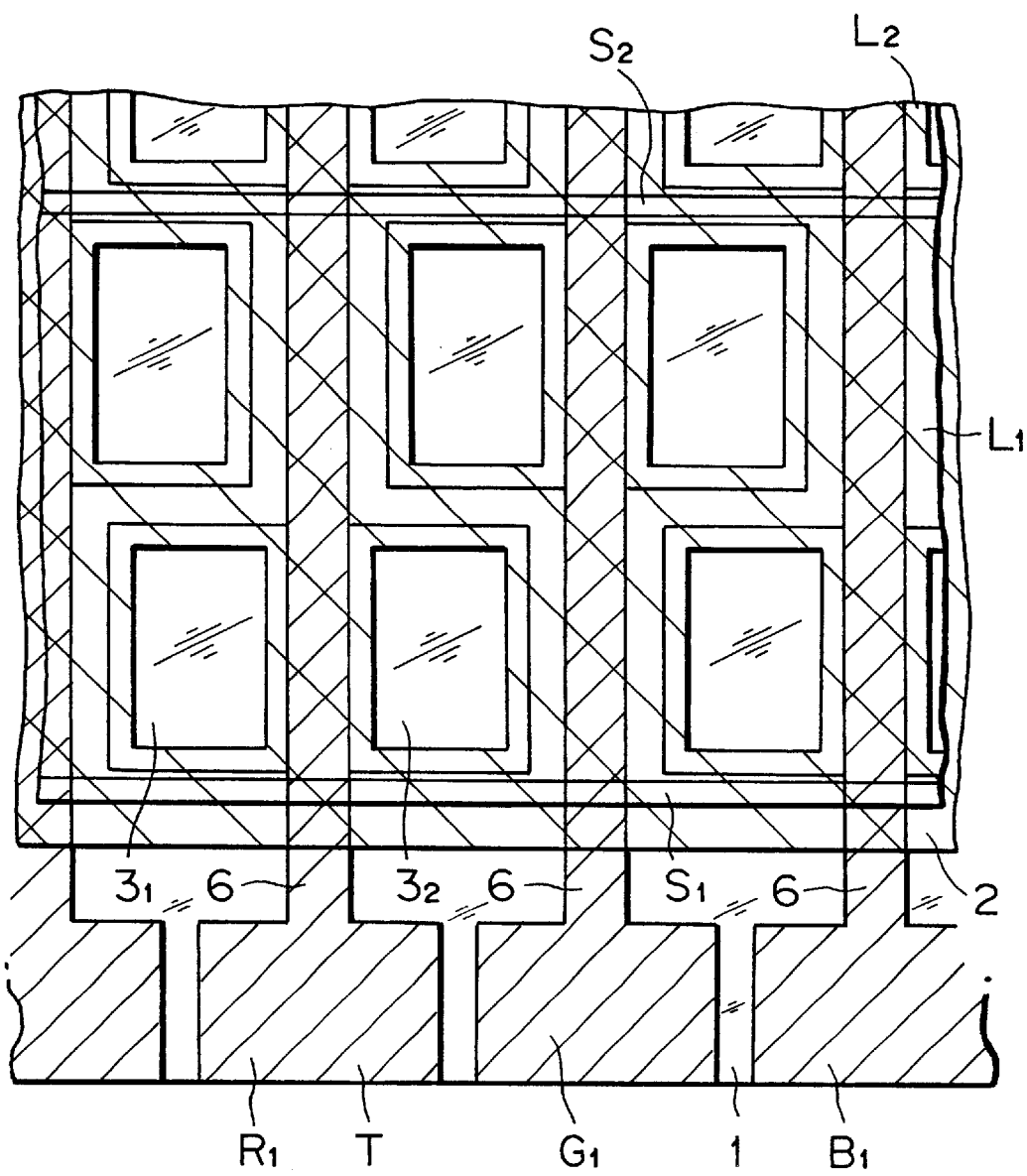
Figure 15:
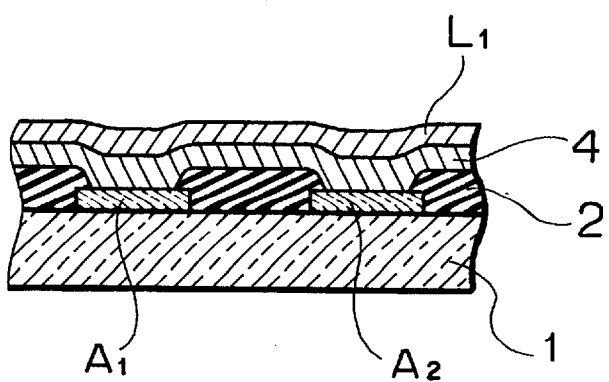
FIG. 15 is a sectional view of a conventional dot matrix display panel.

As shown in FIG. 14, separating walls S1, S2, S3 . . . are formed, and metallic layers L1, L2, . . . are formed. Finally, a protection layer is formed, thus completing the manufacturing process.

What is claimed is:

1. An organic EL full color display panel with three pixels of R, G and B located most proximate to one another arranged in a delta shape, comprising:

a base plate;

a plurality of transparent electrode lines formed in parallel on said base plate;

an insulating layer formed on said base plate, said insulating layer covering respective edges of said transparent electrode lines and having openings formed so as correspond to pixel regions on said transparent electrode lines;

at least one organic EL material layer formed so as to correspond to said pixel regions and having any light-emitting function of R, G and B, and a plurality of metallic electrode lines arranged in parallel perpendicularly to the said transparent electrode lines, each of said metallic electrode entirely covering the pixel regions of said three pixels of R, G and B, wherein said insulating layer insulates said transparent electrode lines and metallic electrode lines from each other in other regions than said pixel regions.

2. An organic EL full color display panel according to claim 1, wherein said insulating layer is formed on an entire surface of said base plate with said transparent electrode lines formed.

3. An organic EL full color display panel according to claim 1, wherein said metallic electrode lines each has a width twice or more as long as that of each pixel in a direction of extending said transparent electrode lines.

4. An organic EL full color display panel according to claim 1, wherein insulating separating walls each for separating adjacent ones of said metallic lines from each other are provided to protrude from said insulating layer.

5. An organic EL full color display panel according to claim 1, wherein said transparent electrode lines each has a larger width in a portion corresponding to each said pixel regions than that in the remaining portion.

6. An organic EL full color display panel according to claim 5, wherein a conductive layer of a conductive material is formed on each said transparent electrode lines at a portion except each said pixel regions.

7. An organic EL full color display panel according to claim 5, wherein connecting terminals are provided on both ends of each said transparent electrode lines.

8. An organic EL full color display panel according to claim 6, wherein said conductive material is a metallic material.

9. An organic EL full color display panel according to claim 6, wherein said conductive layer is extended to each said pixel regions.

10. An organic EL full color display panel according to claim 9, wherein said openings are made on both sides of said conductive layer.

11. A method of manufacturing an organic EL full color display panel with three pixels of R, G and B located most proximate to one another arranged in a delta shape, comprising the steps of:

forming a plurality of transparent electrode lines in parallel on a base plate;

forming an insulating layer on an entire surface except terminals of said transparent electrode lines;

patterning said insulating layer to cover respective edges of said transparent electrode lines and to provide openings formed so as to correspond to pixel regions on said transparent electrode lines;

forming at least one organic EL material layer correspondingly to said pixel regions and having any light-emitting function of R, G and B, and forming a plurality of metallic electrode lines in parallel perpendicularly to the said transparent electrode lines so that each of said metallic electrode entirely covering the pixel regions of said three pixels of R, G and B.

12. A method of manufacturing an organic EL full color display panel according to claim 11, wherein said insulating layer is formed on an entire surface of said base plate with said transparent electrode lines formed.

13. A method of manufacturing an organic EL full color display panel according to claim 11, wherein said metallic electrode lines each has a width twice or more as long as that of each pixel in a direction of extending said transparent electrode lines.

14. A method of manufacturing an organic EL full color display panel according to claim 11, further comprising the step of forming insulating separating walls each for separating adjacent ones of said metallic lines from each other so as to protrude from said insulating layer.

15. A method of manufacturing an organic EL full color display panel according to claim 11, wherein said transparent electrode lines each has a larger width in a portion corresponding to each said pixel regions than that in the remaining portion.

16. A method of manufacturing an organic EL full color display panel according to claim 15, further comprising the step of forming a conductive layer of a conductive material on each said transparent electrode lines at a portion except each said pixel regions.

17. A method of manufacturing an orgainic EL full color display panel according to claim 15, wherein connecting terminals are provided on both ends of each said transparent electrode lines.

18. A method of manufacturing an organic EL full color display panel according to claim 16, wherein said conductive material is a metallic material.

19. A method of manufacturing an organic EL full color display panel according to claim 16, wherein said conductive layer is extended to each said pixel regions.

20. A method of manufacturing an organic EL full color display panel according to claim 18, wherein said openings are made on both sides of said conductive layer.

21. A method of manufacturing an organic EL full color display panel according to claim 20, wherein said conductive layer is extended to both connecting terminals.

* * * * *